(12) United States Patent
Yanagawa

(10) Patent No.: US 10,228,423 B2
(45) Date of Patent: Mar. 12, 2019

(54) SEMICONDUCTOR DEVICE, BATTERY MONITORING SYSTEM, AND DETECTION METHOD

(71) Applicant: LAPIS Semiconductor Co., Ltd., Yokohama (JP)

(72) Inventor: Kenji Yanagawa, Yokohama (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 0 days.

(21) Appl. No.: 15/498,400

(22) Filed: Apr. 26, 2017

(65) Prior Publication Data

US 2017/0315176 A1 Nov. 2, 2017

(30) Foreign Application Priority Data

Apr. 27, 2016 (JP) ................................. 2016-089658

(51) Int. Cl.
*G01R 31/36* (2006.01)
*H03K 5/24* (2006.01)

(52) U.S. Cl.
CPC ............. *G01R 31/362* (2013.01); *H03K 5/24* (2013.01)

(58) Field of Classification Search
None
See application file for complete search history.

(56) References Cited

U.S. PATENT DOCUMENTS

| 6,803,766 B2* | 10/2004 | Kobayashi | G01R 19/16542 320/116 |
| 7,714,540 B2* | 5/2010 | Shibuya | H02J 7/0018 320/104 |
| 2003/0052688 A1* | 3/2003 | Yudahira | G01R 19/16542 324/429 |
| 2012/0139545 A1* | 6/2012 | Makihara | G01R 31/362 324/426 |

FOREIGN PATENT DOCUMENTS

JP 2012047520 3/2012

* cited by examiner

*Primary Examiner* — Melissa J Koval
*Assistant Examiner* — Nasima Monsur
(74) *Attorney, Agent, or Firm* — JCIPRNET

(57) ABSTRACT

A semiconductor device, a battery monitoring system, and a detection method are provided. An end of the capacitor (C1) is switchable to be connected to one of a positive electrode and a negative electrode of a battery cell. An end of a capacitor (C2) is switchable to be connected to the other electrode. A comparator includes a non-inverted input terminal connectable to the battery cell via the capacitor (C1), and an inverted input terminal connectable to the battery cell via the capacitor (C2). A capacitor (C3) is located between a node (inp) and a switch (S1) that switches a connection state between a ground voltage source and any one of reference voltage sources. A capacitor (C4) is located between a node (inn) and a switch (S2) that switches a connection state between the ground voltage source and any one of the reference voltage sources.

10 Claims, 8 Drawing Sheets

SEMICONDUCTOR DEVICE, BATTERY MONITORING SYSTEM, AND DETECTION METHOD

CROSS-REFERENCE TO RELATED APPLICATION

This application claims the priority benefit of Japan application serial no. 2016-089658, filed on Apr. 27, 2016. The entirety of the above-mentioned patent application is hereby incorporated by reference herein and made a part of this specification.

BACKGROUND OF THE INVENTION

Field of the Invention

The invention relates to a semiconductor device, a battery monitoring system, and a detection method.

Description of Related Art

It is conventional to detect the battery voltage of a battery cell of a secondary battery, such as nickel-hydrogen battery and lithium battery. By detecting the battery voltage of the battery cell, for example, it is possible to detect whether the battery cell is in an abnormal state, e.g., overcharge state, so as to protect the battery cell itself.

A detection circuit 126 that combines a differential amplifier 126A, which includes resistors R1 to R4 and a comparator A0, with a comparator C0, as shown in FIG. 13, is known as a technique for detecting the battery voltage of the battery cell. For instance, Patent Literature 1 has disclosed technology of a battery voltage detection device that uses such a detection circuit.

In the conventional technology, as shown in FIG. 13, the positive electrode voltage and the negative electrode voltage of the battery cell under detection, which is selected by a cell selection switch 124 having switches SW corresponding to the battery cells V of battery cells V1 to Vn, are inputted to the input terminal of the differential amplifier 126A via the resistors R1 and R2. The comparator C0 outputs the comparison result that is obtained by comparing the output of the differential amplifier 126A with the reference voltage $V_{REF}$ as a detection signal.

PRIOR ART LITERATURE

Patent Literature

Patent Literature 1: Japanese Patent Publication No. 2012-47520

In the conventional detection circuit 126 as shown in FIG. 13, when the cell selection switch 124 is turned on and the positive electrode voltage and the negative electrode voltage of the battery cell V are supplied to the differential amplifier 126A, a current constantly flows through the resistors R1 to R4 and therefore the battery voltage is consumed. In order to suppress the current consumption caused by the resistors R1 to R4, it is necessary to increase the resistances of the resistors R1 to R4. However, as the resistances increase, the area required for disposing the resistors R1 to R4 increases. For this reason, the increase of the resistances of the resistors R1 to R4 may result in increase of the overall area of the detection circuit 126 and make it difficult to downsize the circuit area.

SUMMARY OF THE INVENTION

The invention provides a semiconductor device, a battery monitoring system, and a detection method that make it possible to achieve low current consumption and miniaturization.

In view of the above, a semiconductor device of the invention includes: a first capacitor group including a first capacitor and a second capacitor, wherein an end of the first capacitor is switchable to be connected to one of a positive electrode and a negative electrode of a battery cell, and an end of the second capacitor is switchable to be connected to the other electrode opposite to the electrode to which the first capacitor is connected; a comparator including a first input terminal and a second input terminal, wherein the first input terminal is connectable to the battery cell via the first capacitor and the second input terminal is connectable to the battery cell via the second capacitor, and the comparator compares a battery voltage of the battery cell, which has been connected, with a predetermined detection voltage; and a second capacitor group including a third capacitor and a fourth capacitor, wherein the third capacitor is connected in series with a first switching element between a first node and the first switching element, and the first node is between the first capacitor and the first input terminal of the comparator, and the first switching element switches a connection state with any one of a ground voltage source that supplies a ground voltage and at least one reference voltage source, and wherein the fourth capacitor is connected in series with a second switching element between a second node and the second switching element, and the second node is between the second capacitor and the second input terminal of the comparator, and the second switching element switches a connection state with any one of the ground voltage source and the at least one reference voltage source.

Moreover, a battery monitoring system of the invention includes: a plurality of batteries connected in series; and a semiconductor device including: a first capacitor group including a first capacitor and a second capacitor, wherein an end of the first capacitor is switchable to be connected to one of a positive electrode and a negative electrode of a battery cell, and an end of the second capacitor is switchable to be connected to the other electrode opposite to the electrode to which the first capacitor is connected; a comparator including a first input terminal and a second input terminal, wherein the first input terminal is connectable to the battery cell via the first capacitor and the second input terminal is connectable to the battery cell via the second capacitor, and the comparator compares a battery voltage of the battery cell, which has been connected, with a predetermined detection voltage; a second capacitor group including a third capacitor and a fourth capacitor, wherein the third capacitor is connected in series with a first switching element between a first node and the first switching element, and the first node is between the first capacitor and the first input terminal of the comparator, and the first switching element switches a connection state with any one of a ground voltage source that supplies a ground voltage and at least one reference voltage source which, and wherein the fourth capacitor is connected in series with a second switching element between a second node and the second switching element, and the second node is between the second capacitor and the second input terminal of the comparator, and the second switching element switches a connection state with any one of the ground voltage source and the at least one reference voltage source; a switching element group including a fifth switching element and a sixth switching element, wherein the fifth switching element is capable of switching to connect an end of the first capacitor to one of the positive electrode and the negative electrode of the battery cell and the sixth switching element is capable of switching to connect an end of the second capacitor to the other electrode of the battery cell opposite to the electrode to which the first capacitor is connected; and a control part performing control, such that after the ground voltage source that supplies the ground voltage and a reference voltage source are connected with the other end of the third capacitor and an other end of the fourth capacitor by the first switching element and the second switching element for a predetermined time, a ground voltage source and a reference voltage source, which is different from the ground voltage source and the reference voltage source connected to the other end of the third capacitor and the other end of the fourth capacitor, the other end of the third capacitor and the other end of the fourth capacitor are connected by the first switching element and the second switching element.

Furthermore, a detection method of the invention is for a semiconductor device to detect a battery voltage of a battery cell. The semiconductor device includes: a first capacitor group including a first capacitor and a second capacitor, wherein an end of the first capacitor is switchable to be connected to one of a positive electrode and a negative electrode of the battery cell, and an end of the second capacitor is switchable to be connected to the other electrode opposite to the electrode to which the first capacitor is connected; a comparator including a first input terminal and a second input terminal, wherein the first input terminal is connectable to the battery cell via the first capacitor and the second input terminal is connectable to the battery cell via the second capacitor, and the comparator compares the battery voltage of the battery cell, which has been connected, with a predetermined detection voltage; and a second capacitor group including a third capacitor and a fourth capacitor, wherein the third capacitor is connected in series with a first switching element between a first node and the first switching element, and the first node is between the first capacitor and the first input terminal of the comparator, and the first switching element switches a connection state with any one of a ground voltage source that supplies a ground voltage and at least one reference voltage source, and wherein the fourth capacitor is connected in series with a second switching element between a second node and the second switching element, and the second node is between the second capacitor and the second input terminal of the comparator, and the second switching element switches a connection state with any one of the ground voltage source and the at least one reference voltage source. The detection method includes a process of connecting the ground voltage source that supplies the ground voltage and a reference voltage source to the third capacitor and the fourth capacitor by the first switching element and the second switching element; and after a predetermined time, connecting a ground voltage source and a reference voltage source, which is different from the ground voltage source and the reference voltage source connected with the third capacitor and the fourth capacitor, to the third capacitor and the fourth capacitor by the first switching element and the second switching element.

According to the invention, it is possible to achieve the effects of low current consumption and miniaturization.

DESCRIPTION OF THE EMBODIMENTS

Hereinafter, each embodiment will be described in detail with reference to the figures.

First Embodiment

Figure 1:
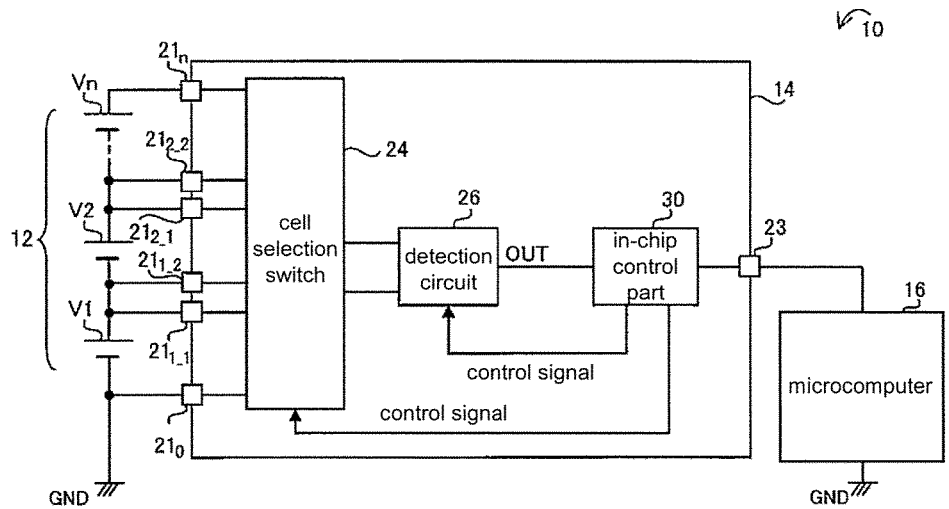
FIG. 1 is a configuration diagram schematically showing an example of the battery monitoring system of the first embodiment.

First, a battery monitoring system of this embodiment is described. FIG. 1 is a configuration diagram schematically showing an example of a battery monitoring system 10 of this embodiment.

As shown in FIG. 1, the battery monitoring system 10 includes a battery cell group 12, a battery monitoring LSI (large scale integrated circuit) 14, and a microcomputer 16.

As shown in FIG. 1 as an example, the battery cell group 12 includes n battery cells V1 to Vn that are connected in series. The battery cells V1 to Vn are arranged in the order of V1, V2, . . . , Vn from the low potential side. In the following description, where the battery cells V1 to Vn are collectively referred to without being distinguished from one another, they are referred to as "battery cells V" without the reference numerals 1 to n, which serve to identify individual battery cells. FIG. 1 illustrates a case where n is 3 or more. However, the number n is not particularly limited, and any number of the battery cells V may be included in the battery cell group 12.

The microcomputer 16 performs control relating to detection of a battery voltage of each battery cell V included in the battery cell group 12, which is carried out by the battery monitoring LSI 14. In this embodiment, the battery monitoring LSI 14 and the microcomputer 16 are configured as separate semiconductor chips respectively.

The battery monitoring LSI 14 monitors a voltage state of each of the battery cells V included in the battery cell group 12. In this embodiment, the battery monitoring LSI 14 corresponds to the semiconductor device of the invention. As shown in FIG. 1, the battery monitoring LSI 14 includes terminals $21_0$ to $21_n$ and 23, a cell selection switch 24, a detection circuit 26, and an in-chip control part 30.

The terminals $21_0$ to $21_n$ are electrode pads for connecting the battery monitoring LSI 14 to the battery cell group 12. The terminal $21_0$ is connected to the negative electrode of the battery cell V1 and grounded. The terminal $21_{1\_1}$ and the terminal $21_{1\_2}$ are connected to the positive electrode (the negative electrode of the battery cell V2) of the battery cell V1. The terminal $21_{2\_1}$ and the terminal $21_{2\_2}$ are connected to the positive electrode (the negative electrode of the battery cell V3, which is omitted from the figure) of the battery cell V2. The terminal $21_n$ is connected to the positive electrode of the battery cell Vn. In the following description, where the terminals $21_0$ to $21_n$ are collectively referred to without being distinguished from one another, they are referred to as "terminals 21" without the reference numerals, which serve to identify individual terminals. In this embodiment, "connection" refers to electrical connection.

The terminal 23 is an electrode pad for connecting the battery monitoring LSI 14 to the microcomputer 16. A signal to be transmitted from the in-chip control part 30 to the microcomputer 16 is outputted from the terminal 23. Moreover, a signal to be transmitted from the microcomputer 16 to the in-chip control part 30 is inputted to the terminal 23.

The cell selection switch 24 (will be described in detail later) is connected to the terminals $21_0$ to $21_n$ and outputs a positive electrode voltage and a negative electrode voltage of one battery cell V, which is selected from the battery cell group 12 according to a control signal supplied from the in-chip control part 30, and supplies them to the detection circuit 26.

The detection circuit 26 (will be described in detail later) outputs a detection signal OUT at a high level if the battery voltage, which is the difference between the positive electrode voltage and the negative electrode voltage of the battery cell V outputted from the cell selection switch 24, is equal to or greater than a detection threshold voltage Vn_th, and outputs the detection signal OUT at a low level if the battery voltage is less than the detection threshold voltage Vn_th. In this embodiment, the detection of the battery voltage of the battery cell V is not detection of a specific voltage value of the battery cell V, but comparison with the detection threshold voltage Vn_th, i.e., a predetermined detection voltage, through the detection circuit 26.

The in-chip control part 30 controls the cell selection switch 24 and the detection circuit 26 according to the control signal supplied from the microcomputer 16. In addition, the in-chip control part 30 transmits the detection signal OUT, etc., of the battery voltage outputted from the detection circuit 26 to the microcomputer 16.

Next, the cell selection switch 24 and the detection circuit 26 of this embodiment are described in detail below.

Figure 2:
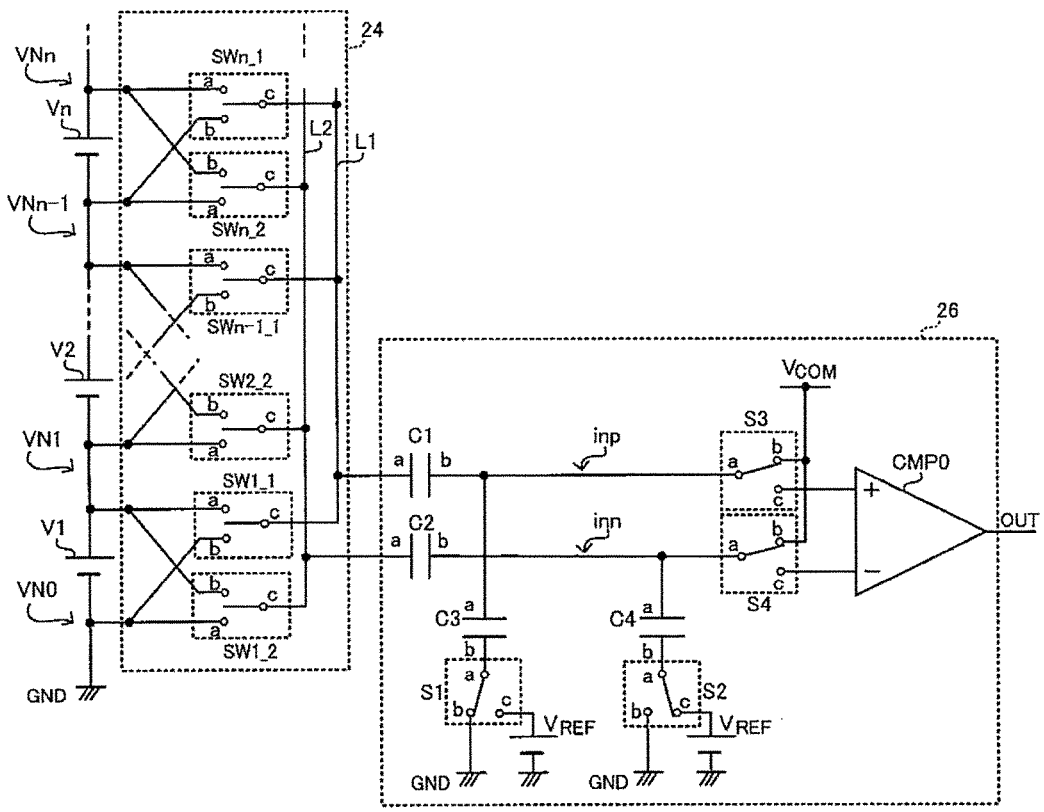
FIG. 2 is a circuit diagram showing an example of the cell selection switch and the detection circuit of the first embodiment.

FIG. 2 illustrates an example of the circuit configurations of the cell selection switch 24 and the detection circuit 26. The battery cells V and the cell selection switch 24 are illustrated only with reference to the battery cells V1, V2, and Vn in FIG. 2 to facilitate the illustration. Besides, the terminals 21 are omitted from FIG. 2.

In the case of y=1 to n, the negative electrode of the battery cell Vy is connected to the node VNy-1 and the positive electrode is connected to the node VNy. As shown in FIG. 2, for example, the negative electrode of the battery cell V1(y=1) is connected to the node VN0 and the positive electrode is connected to the node VN1.

In addition, the cell selection switch 24 includes switches SW1_1 to SWn_1 and SW1_2 to SWn_2 respectively corresponding to the battery cells V. The switches SW1_1 to SWn_1 connect the positive electrode or the negative electrode of each battery cell V to a signal line L1 under control of the in-chip control part 30. Moreover, the switches SW1_2 to SWn_2 connect the positive electrode or the negative electrode of each battery cell V to a signal line L2 under control of the in-chip control part 30. In the following description, where the switches SW1_1 to SWn_1 and SW1_2 to SWn_2 are collectively referred to without being distinguished from one another, they are referred to as "switches SW" without the reference numerals, which serve to identify individual switches.

In the case of y=1 to n, the terminal a of the switch SWy_1 is connected to the node VNy, the terminal b is connected to the node VNy-1, and the terminal c is connected to the terminal a of a capacitor C1 via the signal line L1 respectively. Besides, the terminal a of the switch SWy_2 is connected to the node VNy-1, the terminal b is connected to the node VNy, the terminal c is connected to the terminal a of a capacitor C2 via the signal line L2 respectively. As shown in FIG. 2, for example, the terminal a of the switch SW1_1 is connected to the node VN1, the terminal b is connected to the node VN0, and the terminal c is connected to the terminal a of the capacitor C1 via the signal line L1 respectively. Moreover, the terminal a of the switch SW1_2 is connected to the node VN0, the terminal b is connected to the node VN1, the terminal c is connected to the terminal a of the capacitor C2 via the signal line L2 respectively.

Further, as shown in FIG. 2, the detection circuit 26 includes capacitors C1 to C4, switches S1 to S4, and a comparator CMP0.

The terminal b of the capacitor C1 is connected to the terminal a of the capacitor C3 and the terminal a of the switch S3. The switch S3 connects the terminal b of the capacitor C1 to a reference voltage source $V_{COM}$, which supplies a reference voltage $V_{COM}$, or a non-inverted input terminal of the comparator CMP0 under control of the in-chip control part 30. The terminal b of the switch S3 is connected to the reference voltage source $V_{COM}$ and the terminal c is connected to the non-inverted input terminal of the comparator CMP0 respectively. The terminal b of the capacitor C3 is connected to the terminal a of the switch S1. The switch S1 connects the terminal b of the capacitor C3 to a ground voltage source GND, which supplies a ground voltage GND, or a reference voltage source $V_{REF}$, which supplies a reference voltage $V_{REF}$, under control of the in-chip control part 30. The terminal b of the switch S1 is connected to the ground voltage source GND and the terminal c is connected to the reference voltage source $V_{REF}$ respectively.

The terminal b of the capacitor C2 is connected to the terminal a of the capacitor C4 and the terminal a of the switch S4. The switch S4 connects the terminal b of the capacitor C2 to the reference voltage source $V_{COM}$ or an inverted input terminal of the comparator CMP0 under control of the in-chip control part 30. The terminal b of the switch S4 is connected to the reference voltage source $V_{COM}$ and the terminal c is connected to the inverted input terminal of the comparator CMP0 respectively. The terminal b of the capacitor C4 is connected to the terminal a of the switch S2. The switch S2 connects the terminal b of the capacitor C4 to the ground voltage source GND or the reference voltage source $V_{REF}$ under control of the in-chip control part 30. The terminal b of the switch S2 is connected to the ground voltage source GND and the terminal c is connected to the reference voltage source $V_{REF}$ respectively.

Next, an operation of detecting the battery voltage performed in the detection circuit 26 of this embodiment is described below. Hereinafter, a specific example of detecting the battery voltage of the $n^{th}$ battery cell Vn is described with reference to FIG. 3 and FIG. 4. Parts that are unnecessary for the description are omitted from FIG. 3 and FIG. 4 to facilitate the illustration.

Figure 3:
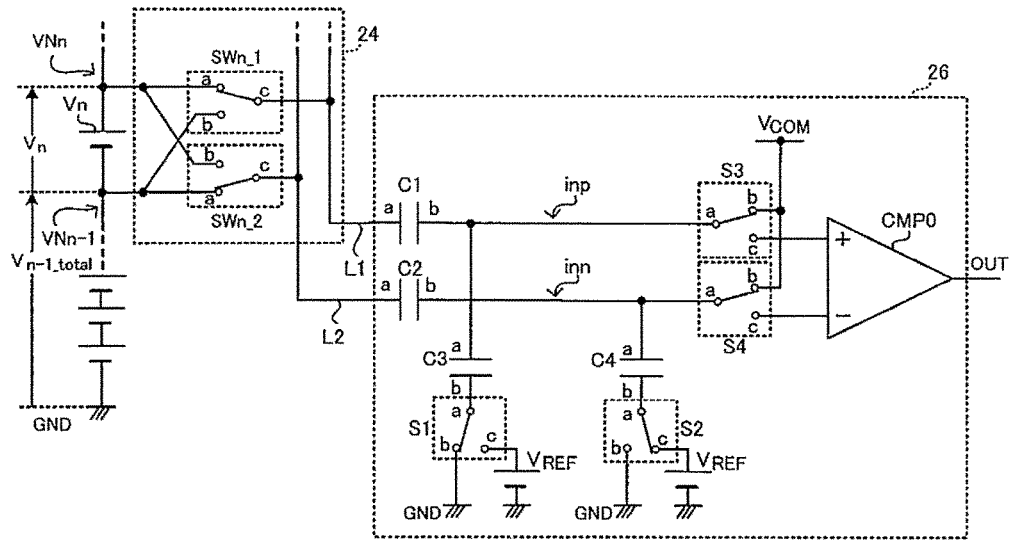
FIG. 3 is a diagram illustrating the charge state of the cell selection switch and the detection circuit of the first embodiment.
Figure 4:
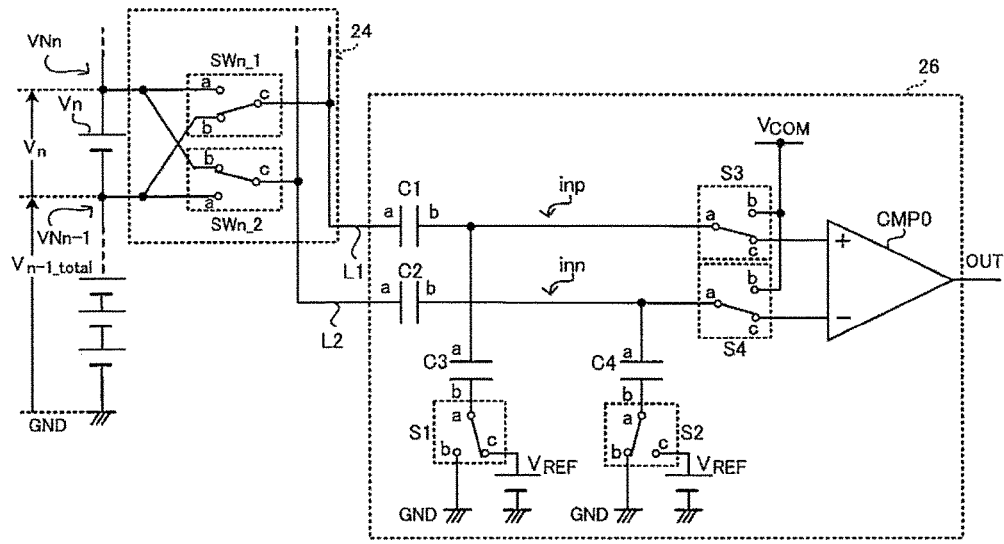
FIG. 4 is a diagram illustrating the comparison state of the cell selection switch and the detection circuit of the first embodiment.

In the case of detecting the battery voltage of the $n^{th}$ battery cell Vn, the in-chip control part 30 controls each switch SW of the cell selection switch 24 and the switches S1 to S4 of the detection circuit 26, as shown in FIG. 3 and FIG. 4. The timings at which the in-chip control part 30 controls the switches SW and the switches S1 to S4 are the same when errors are not taken into consideration.

First, as shown in FIG. 3, the in-chip control part 30 sets the cell selection switch 24 and the detection circuit 26 to a charge state.

Specifically, the in-chip control part 30 enables the switch SWn_1 of the cell selection switch 24 to select the node VNn (the terminal a), enables the switch SWn_2 of the cell selection switch 24 to select the node VNn-1 (the terminal a), and sets the other switches SW to a non-selected state (a state where neither the terminal a nor the terminal b is selected).

Further, the in-chip control part 30 enables the switch S1 of the detection circuit 26 to select the ground voltage source GND (the terminal b), enables the switch S2 to select the reference voltage source $V_{REF}$ (the terminal c), enables the switch S3 to select the reference voltage source $V_{COM}$ (the terminal b), and enables the switch S4 to select the reference voltage source $V_{COM}$ (the terminal b).

Here, when the battery voltage of the battery cell Vn is Vn, a total of the battery voltages of the battery cells V1 to Vn-1 is Vn-1_total, and the capacitances of the capacitors C1 to C4 are Cp1 to Cp4, charge amounts Q1 to Q4 respectively charged to the capacitors C1 to C4 are represented by the following equations (1) to (4).

$$Q1=Cp1\times(Vn+Vn\text{-}1\_total-V_{COM}) \quad (1)$$

$$Q2=Cp2\times V_{COM} \quad (2)$$

$$Q3=Cp3\times(Vn\text{-}1\_total-V_{COM}) \quad (3)$$

$$Q4=Cp4\times(V_{COM}-V_{REF}) \quad (4)$$

When the charge amount charged to the node inp between the terminal b of the capacitor C1 and the terminal a of the switch S3 is Qp and the charge amount charged to the node inn between the terminal b of the capacitor C2 and the terminal a of the switch S4 is Qn, the charge amounts Qp and Qn are represented by the following equations (5) and (6).

$$Qp=Q2-Q1=Cp2\times V_{COM}-Cp1\times(Vn+Vn\text{-}1\_total-V_{COM}) \quad (5)$$

$$Qn=Q4-Q3=Cp4\times(V_{COM}-V_{REF})-Cp3\times(Vn\text{-}1\_total-V_{COM}) \quad (6)$$

In the charge state, after each capacitor C is stored with sufficient charge, the in-chip control part 30 controls the switches SW and the switches S1 to S4 to switch the cell selection switch 24 and the detection circuit 26 from the charge state to a comparison state, as shown in FIG. 4.

Specifically, the in-chip control part 30 enables the switch SWn_1 of the cell selection switch 24 to select the node VNn-1 (the terminal b), enables the switch SWn_2 to select the node VNn (the terminal b), and sets the other switches SW of the cell selection switch 24 to the non-selected state (the state where neither the terminal a nor the terminal b is selected).

Further, the in-chip control part 30 enables the switch S1 of the detection circuit 26 to select the reference voltage source $V_{REF}$ (the terminal c), enables the switch S2 to select the ground voltage source GND (the terminal b), enables the switch S3 to select the non-inverted input terminal (the terminal c) of the comparator CMP0, and enables the switch S4 to select the inverted input terminal (the terminal c) of the comparator CMP0.

Here, when the voltage of the node inp is Vinp and the voltage of the node inn is Vinn, the charge amounts Q1' to Q4' respectively charged to the capacitors C1 to C4 in the comparison state are represented by the following equations (7) to (10).

$$Q1'=Cp1\times(Vn\text{-}1\_total-Vinp) \quad (7)$$

$$Q2'=Cp2\times(Vinp-V_{REF}) \quad (8)$$

$$Q3'=Cp3\times(Vn+Vn\text{-}1\_total-Vinn) \quad (9)$$

$$Q4'=Cp4\times Vinn \quad (10)$$

When the charge amount charged to the node inp is Qp' and the charge amount charged to the node inn is Qn', the charge amounts Qp' and Qn' in the comparison state are represented by the following equations (11) and (12).

$$Qp'=Q2'-Q1'=Cp2\times(Vinp-V_{REF})-Cp1\times(Vn\text{-}1\_total-Vinp) \quad (11)$$

$$Qn'=Q4'-Q3'=Cp4\times Vinn-Cp3\times(Vn+Vn\text{-}1\_total-Vinn) \quad (12)$$

When the input impedances of the non-inverted input terminal and the inverted input terminal of the comparator CMP0 are sufficiently high, the charge amount Qp stored in the node inp and the charge amount Qn stored in the node inn do not change despite the shift from the charge state to the comparison state. Thus, the following equations (13) and (14) hold.

$$Qp=Qp' \quad (13)$$

$$Qn=Qn' \quad (14)$$

From the above equations (5), (11), and (13), the following equation (15) with respect to the voltage Vinp is obtained. Besides, from the above equations (6), (12), and (14), the following equation (16) with respect to the voltage Vinn is obtained.

$$Vinp=V_{COM}-Cp1/(Cp1+Cp2)\times Vn+Cp2/(Cp1+Cp2)\times V_{REF} \quad (15)$$

$$Vinn=V_{COM}+Cp3/(Cp3+Cp4)\times Vn-Cp4/(Cp3+Cp4)\times V_{REF} \quad (16)$$

According to the equation (15), the voltage Vinp has a negative slope with respect to the battery voltage Vn, and according to the equation (16), the voltage Vinn has a positive slope with respect to the battery voltage Vn. The relationship between the voltages Vinp and Vinn and the battery voltage Vn, obtained by the equations (15) and (16), is as illustrated in FIG. 5, for example.

Figure 5:
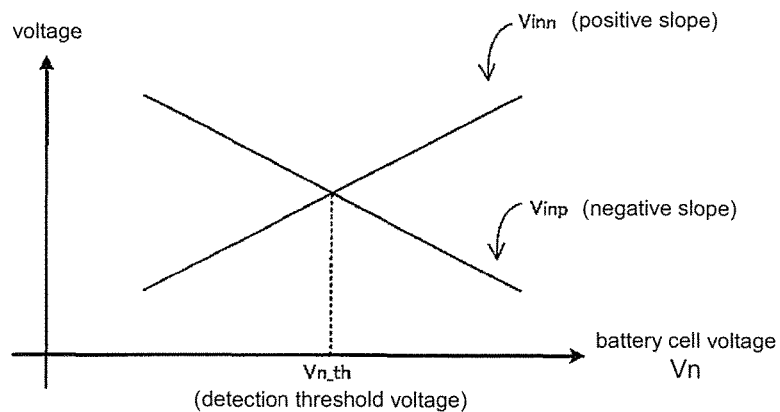
FIG. 5 is a graph illustrating a relationship between the voltage Vinp of the node inp and the voltage Vinn of the node inn, and the battery voltage Vn.

As illustrated in FIG. 5, a line representing the voltage Vinn and a line representing the voltage Vinp intersect each other when the battery voltage Vn is Vn_th (Vn=Vn_th).

Accordingly, the comparator CMP0 operates by setting the voltage where the voltage Vinn and the voltage Vinp become equal (Vinn=Vinp) as the detection threshold voltage Vn_th. The comparator CMP0 outputs a detection signal at the high level when the voltage Vinn is equal to or greater than the voltage Vinp (Vinn≥Vinp), and outputs a detection signal at the low level when the voltage Vinn is less than the voltage Vinp (Vinn<Vinp).

Based on the above equations (15) and (16), the detection threshold voltage Vn_th of the comparator CMP0 is represented by the following equation (17).

$$Vn\_th=\{Cp2/(Cp1+Cp2)+Cp4/(Cp3+Cp4)\}/\{Cp1/(Cp1+Cp2)+Cp3/(Cp3+Cp4)\}\times V_{REF} \quad (17)$$

It is known from the equation (17) that the detection threshold voltage Vn_th depends on the capacitances Cp1 to Cp4 of the capacitors C1 to C4 and the reference voltage $V_{REF}$. Accordingly, the comparator CMP0 of this embodiment can set the detection threshold voltage Vn_th to any value according to the capacitances Cp1 to Cp4 of the capacitors C1 to C4 and the value of the reference voltage $V_{REF}$.

Moreover, regarding the capacitances Cp1 to Cp4 of the capacitors C1 to C4, in the case of using the following equations (18) to (19) represented with use of arbitrary constants j, k, and m, the above equation (17) can be represented by the following equation (21).

$$Cp2=j\times Cp1 \quad (18)$$

$$Cp3=k\times Cp1 \quad (19)$$

$$Cp4=m\times Cp1 \quad (20)$$

$$Vn\_th=\{j/(1+j)+m/(k+m)\}/\{1/(1+j)+1/(k+m)\}\times V_{REF} \quad (21)$$

It is known from the equation (21) that the detection threshold voltage Vn_th depends on capacitance ratios (j, k, in) of the capacitors C1 to C4 and the reference voltage $V_{REF}$. Accordingly, the comparator CMP0 of this embodiment can set the detection threshold voltage Vn_th to any value according to the capacitance ratios of the capacitors C1 to C4 and the value of the reference voltage $V_{REF}$.

Accordingly, by selecting the capacitance ratios of the capacitors C1 to C4 and the reference voltage $V_{REF}$ to set the detection threshold voltage Vn_th to a desired value, the battery voltage V can be detected through the detection circuit 26.

For example, by setting the level of the detection threshold voltage Vn_th to a level corresponding to an overcharge detection voltage, when the detection signal outputted from the comparator CMP0 in the comparison state is at the high level, the overcharge state of the battery cell V can be detected.

The above illustrates a case of detecting the battery voltage of the battery cell Vn. For the other battery cells V, it is also possible to detect the battery voltage based on the level of the detection signal outputted from the comparator CMP0 in the comparison state by switching from the charge state to the comparison state in the same manner.

Figure 6:
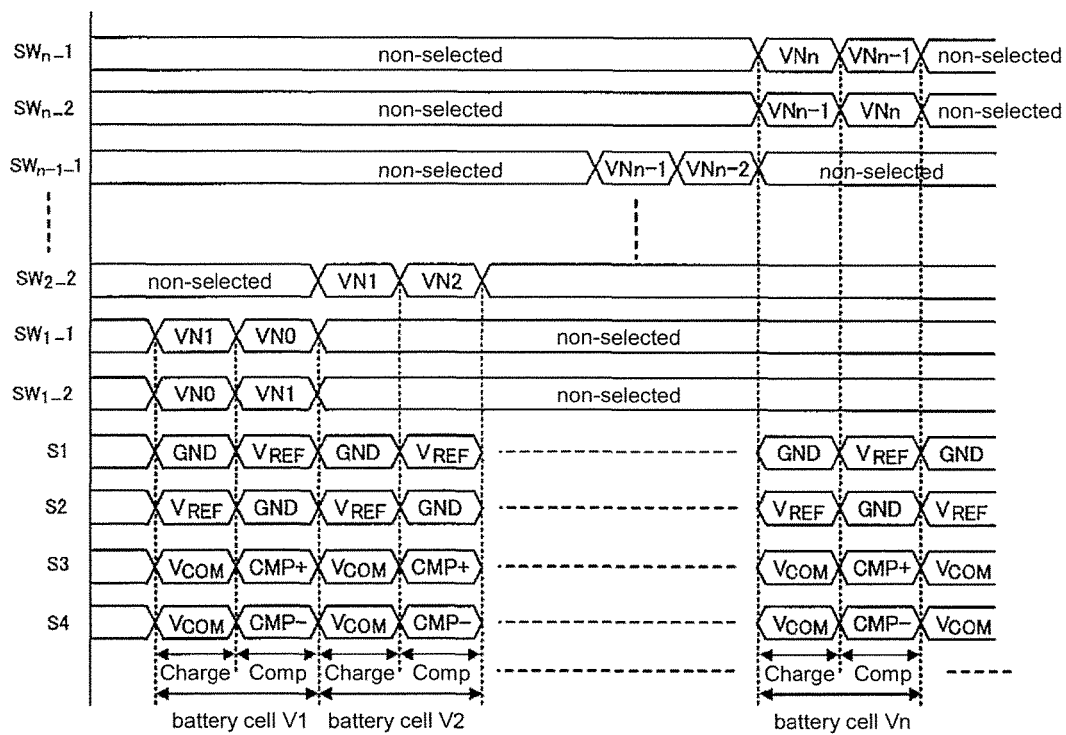
FIG. 6 is a timing chart showing the timing relating to detection of the battery voltage according to the first embodiment.

FIG. 6 is a timing chart showing connection destinations (selection destinations) of the switches SW of the cell selection switch 24 and the switches S1 to S4 of the detection circuit 26 relating to detection of the battery voltage of the battery cell V in this embodiment, wherein CMP+ and CMP– respectively represents that the connection destination is the non-inverted input terminal and the inverted input terminal of the comparator CMP0.

As shown in FIG. 6, when carrying out detection of the battery voltages of the battery cells V, the in-chip control part 30 repeats the control on the charge state (FIG. 6, refer to "Charge") and the comparison state (FIG. 6, refer to "Comp") in the order starting from the battery cell V on the low voltage side, so as to detect the battery voltage of each battery cell V in a time division manner. A specific time required for each state is determined according to ON resistances of the cell selection switch 24 and the switches S1 to S4 and time constants of the capacitors C1 to C4.

The switches S1 to S4 of the detection circuit 26 repeat the charge state and the comparison state by switching the connection destinations (selection destinations), as described above, for each battery cell V. Further, regarding the switches SW of the cell selection switch 24, only the switch SW corresponding to the detected battery cell V is switched to make the node on the negative electrode side and the node on the positive electrode side of the battery cell V, which become the connection destination (selection destination), be switched between the charge state and the comparative state as described above.

Then, in the battery monitoring LSI 14 of this embodiment, as described above, for example, when the level of the detection threshold voltage Vn_th of the comparator CMP0 is at the level corresponding to the overcharge detection voltage, the in-chip control part 30 detects whether each battery cell V is in the overcharge state based on the level of the detection signal OUT outputted from the comparator CMP0 of the detection circuit 26 in the comparison state. The detection signal OUT may also be outputted from the in-chip control part 30 to the microcomputer 16 for the microcomputer 16 to detect whether the battery cell V is in the overcharge state based on the level of the detection signal OUT.

Second Embodiment

In the detection circuit 26 of the first embodiment described above, one detection threshold voltage V_th can be set to the comparator CMP0. Therefore, with the detection circuit 26 of the first embodiment, it is possible to detect whether the state of the battery voltage of the battery cell is a specific state or not.

In contrast thereto, the detection circuit 26 of this embodiment is capable of setting a plurality of detection threshold voltages V_th to the comparator CMP0.

Since the overall configuration of the battery monitoring system 10 is substantially the same as that of the first embodiment, the description thereof is omitted here, and the following will describe the detection circuit 26 of this embodiment.

Figure 7:
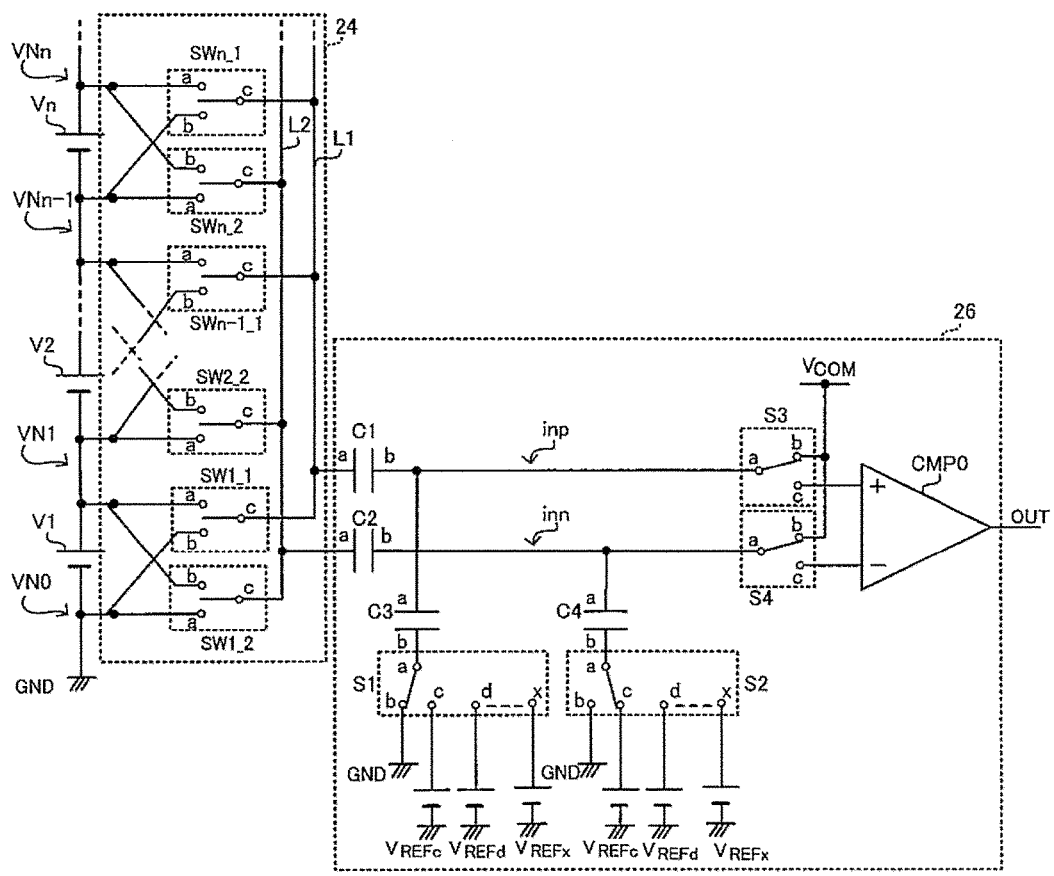
FIG. 7 is a circuit diagram showing an example of the cell selection switch and the detection circuit of the second embodiment.

FIG. 7 illustrates an example of the circuit configurations of the cell selection switch 24 and the detection circuit 26 of this embodiment. The battery cells V and the cell selection switch 24 are illustrated only with reference to the battery cells V1, V2, and Vn in FIG. 7 to facilitate the illustration. Besides, the terminals 21 are omitted from FIG. 7.

As shown in FIG. 7, the cell selection switch 24 of this embodiment is the same as the cell selection switch 24 of the first embodiment. Therefore, the description thereof is omitted here.

In the detection circuit 26 of this embodiment as shown in FIG. 7, the configuration of the switches S1 and S2 is different from the configuration of the switches S1 and S2 of the first embodiment. The switches S1 and S2 of the first embodiment include the terminals a to c. However, the switches S1 and S2 of this embodiment include terminals a to x, and the number of the included terminals is greater than the number of the terminals in the switches S1 and S2 of the first embodiment.

The terminals b of the switches S1 and S2 are connected to the ground voltage source GND. In addition, the terminals c to x are connected to reference voltage sources $V_{REFc}$ to $V_{REFx}$ that supply different reference voltages $V_{REF}$ ($V_{REFc}$ to $V_{REFx}$) respectively. The switch S1 connects the terminal b of the capacitor C3 to the ground voltage source GND or any one of the reference voltage sources $V_{REFc}$ to $V_{REFx}$ under control of the in-chip control part 30. Besides, the switch S2 connects the terminal b of the capacitor C4 to the ground voltage source GND or any one of the reference voltage sources $V_{REFc}$ to $V_{REFx}$ under control of the in-chip control part 30.

That is, in the detection circuit 26 of this embodiment, the reference voltage source connected to the terminals b of the capacitors C3 and C4 can be switched to any one of the reference voltage sources $V_{REFc}$ to $V_{REFx}$.

Nevertheless, the number of the reference voltage sources $V_{REFc}$ to $V_{REFx}$ and where they are disposed are not particularly limited. In this embodiment, although not shown, they are disposed outside the detection circuit 26 in the battery monitoring LSI 14 as an example.

The operation of detecting the battery voltage performed in the detection circuit 26 of this embodiment is described below. Hereinafter, a specific example that has reference voltages $V_{REF1}$ and $V_{REF2}$ for detecting the battery voltage of the $n^{th}$ battery cell Vn is described with reference to FIG. 8 and FIG. 9. Parts that are unnecessary for the description are omitted from FIG. 8 and FIG. 9 to facilitate the illustration.

Like the detection operation of the battery voltage performed in the detection circuit 26 of the first embodiment, the detection operation of the battery voltage performed in the detection circuit 26 of this embodiment can detect the battery voltage based on the level of the detection signal outputted from the comparator CMP0 in the comparison state by switching from the charge state to the comparison state.

Figure 8:
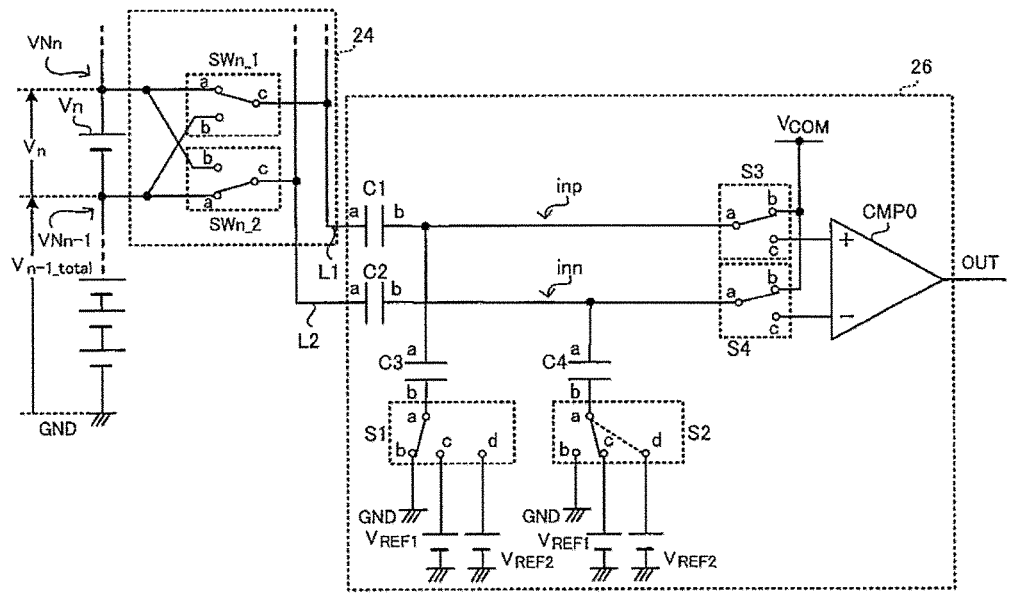
FIG. 8 is a diagram illustrating the charge state of the cell selection switch and the detection circuit of the second embodiment.
Figure 9:
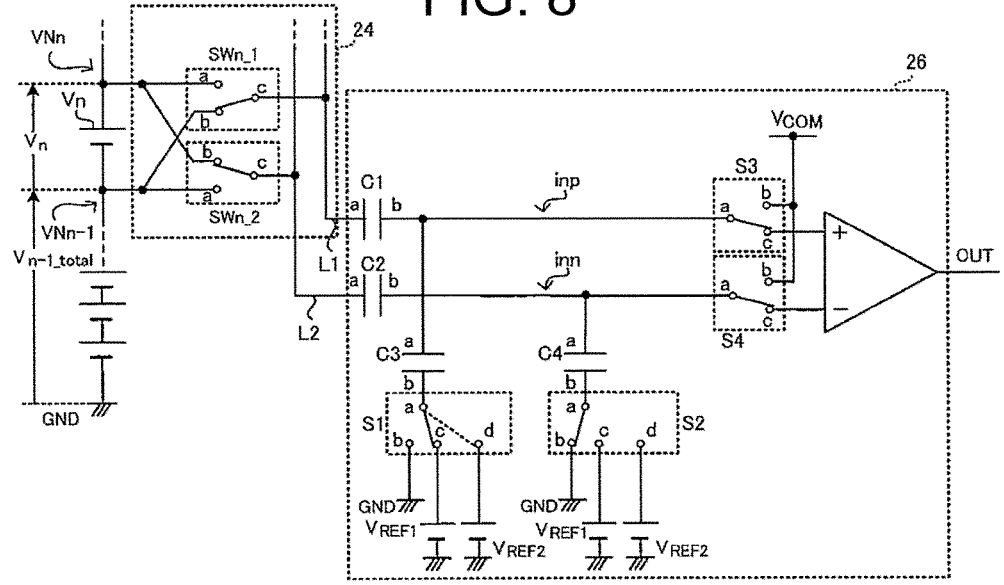
FIG. 9 is a diagram illustrating the comparison state of the cell selection switch and the detection circuit of the second embodiment.

In the case of detecting the battery voltage of the $n^{th}$ battery cell Vn, the in-chip control part 30 controls each switch SW of the cell selection switch 24 and the switches S1 to S4 of the detection circuit 26, as shown in FIG. 8 and FIG. 9. The timings at which the in-chip control part 30 controls the switches SW and the switches S1 to S4 are the same when errors are not taken into consideration.

First, by using the reference voltage $V_{REF1}$, the in-chip control part 30 sets the cell selection switch 24 and the detection circuit 26 to the charge state, as shown in FIG. 8.

Specifically, the in-chip control part 30 enables the switch SWn_1 of the cell selection switch 24 to select the node VNn (the terminal a), enables the switch SWn_2 to select the node VNn-1 (the terminal a), and sets the other switches SW to the non-selected state (the state where neither the terminal a nor the terminal b is selected) in the same manner as the first embodiment.

Further, the in-chip control part 30 enables the switch S1 of the detection circuit 26 to select the ground voltage source GND (the terminal b), enables the switch S2 to select the reference voltage source $V_{REF1}$ (the terminal c) (FIG. 8, refer to the solid line of the switch S2), enables the switch S3 to select the reference voltage source $V_{COM}$ (the terminal b), and enables the switch S4 to select the reference voltage source $V_{COM}$ (the terminal b).

In the charge state, after each capacitor C is stored with sufficient charge, the in-chip control part 30 controls the switches SW and the switches S1 to S4 to switch the cell selection switch 24 and the detection circuit 26 from the charge state to the comparison state, as shown in FIG. 9.

Specifically, the in-chip control part 30 enables the switch SWn_1 of the cell selection switch 24 to select the node VNn-1 (the terminal b), enables the switch SWn_2 to select the node VNn (the terminal b), and sets the other switches SW of the cell selection switch 24 to the non-selected state (the state where neither the terminal a nor the terminal b is selected) in the same manner as the first embodiment.

Further, the in-chip control part 30 enables the switch S1 of the detection circuit 26 to select the reference voltage source $V_{REF1}$ (the terminal c) (FIG. 9, refer to the solid line of the switch S1), enables the switch S2 to select the ground voltage source GND (the terminal b), enables the switch S3 to select the non-inverted input terminal (the terminal c) of the comparator CMP0, and enables the switch S4 to select the inverted input terminal (the terminal c) of the comparator CMP0.

In this case, the detection threshold voltage can be represented by the following equation (22) based on the equation (21) described in the first embodiment.

$$Vn\_th1=\{j/(1+j)+m/(k+m)\}/\{1/(1+j)+1/(k+m)\}\times V_{REF1} \quad (22)$$

Next, by using the reference voltage $V_{REF2}$, the in-chip control part 30 sets the cell selection switch 24 and the detection circuit 26 to the charge state again, as shown in FIG. 8. Regarding the control that the in-chip control part 30 performs over the cell selection switch 24, the case of the charge state is the same as the case of using the reference voltage $V_{REF1}$ described above in the comparison state, and thus the description thereof is omitted here.

On the other hand, the in-chip control part 30 enables the switch S1 of the detection circuit 26 to select the ground voltage source GND (the terminal b), enables the switch S2 to select the reference voltage source $V_{REF2}$ (the terminal d) (FIG. 8, refer to the dotted line of the switch S2), enables the switch S3 to select the reference voltage source $V_{COM}$ (the terminal b), and enables the switch S4 to select the reference voltage source $V_{COM}$ (the terminal b).

In the charge state, after each capacitor C is stored with sufficient charge, the in-chip control part 30 controls the switches SW and the switches S1 to S4 to switch the cell selection switch 24 and the detection circuit 26 from the charge state to the comparison state, as shown in FIG. 9.

The in-chip control part 30 enables the switch S1 of the detection circuit 26 to select the reference voltage source $V_{REF2}$ (the terminal d) (FIG. 9, refer to the dotted line of the switch S1), enables the switch S2 to select the ground voltage source GND (the terminal b), enables the switch S3 to select the non-inverted input terminal (the terminal c) of the comparator CMP0, and enables the switch S4 to select the inverted input terminal (the terminal c) of the comparator CMP0.

In this case, the detection threshold voltage can be represented by the following equation (23) based on the equation (21) described in the first embodiment.

$$Vn\_th2=\{j/(1+j)+m/(k+m)\}/\{1/(1+j)+1/(k+m)\}\times V_{REF2} \quad (23)$$

By the above equations (21) and (22), according to the detection circuit 26 of this embodiment, the detection threshold voltages Vn_th1 and Vn_th2 can be set to any value based on the reference voltages $V_{REF1}$ and $V_{REF2}$. Accordingly, by switching the reference voltages $V_{REF1}$ and $V_{REF2}$ to perform the detection operation, the battery voltage V can be detected with use of the two detection threshold voltages Vn_th1 and Vn_th2 respectively.

For example, by setting the level of the detection threshold voltage Vn_th1 to a level corresponding to the overcharge detection voltage, when the detection signal outputted from the comparator CMP0 in the comparison state is at the high level, the overcharge state of the battery cell V can be detected. Moreover, by setting the level of the detection threshold voltage Vn_th2 to a level corresponding to the overdischarge detection voltage, when the detection signal outputted from the comparator CMP0 in the comparison state is at the low level, the overdischarge state of the battery cell V can be detected.

The above illustrates a case of detecting the battery voltage of the battery cell Vn. For the other battery cells V, it is also possible to detect the battery voltage based on the level of the detection signal outputted from the comparator CMP0 in the comparison state by switching from the charge state to the comparison state in the same manner.

Figure 10:
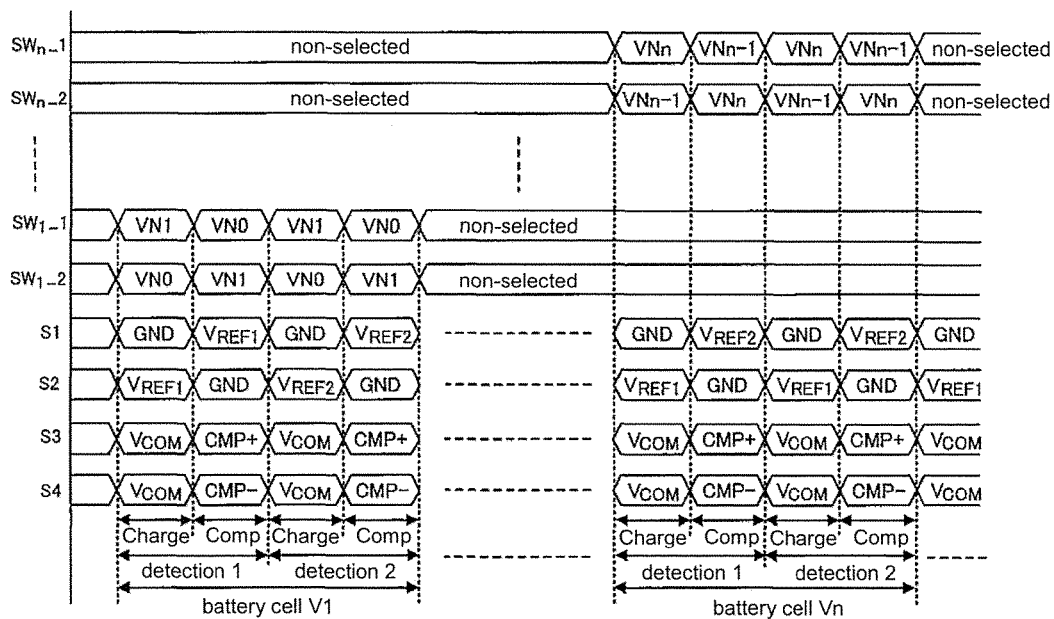
FIG. 10 is a timing chart showing the timing relating to detection of the battery voltage according to the second embodiment.

FIG. 10 is a timing chart showing connection destinations (selection destinations) of the switches SW of the cell selection switch 24 and the switches S1 to S4 of the detection circuit 26 relating to detection of the battery voltage of the battery cell V in this embodiment.

As shown in FIG. 10, when carrying out detection of the battery voltages of the battery cells V, the in-chip control part 30 repeats the control on the charge state (FIG. 10, refer to "Charge") and the comparison state (FIG. 10, refer to "Comp") in the order starting from the battery cell V on the low voltage side, and repeats "detection 1" using the reference voltage $V_{REF1}$ and "detection 2" using the reference voltage $V_{REF2}$, so as to detect the battery voltage of each battery cell V in a time division manner.

With the in-chip control part 30 performing such control, in the battery monitoring LSI 14 of this embodiment, as described above, for example, when the level of the detection threshold voltage Vn_th1 of the comparator CMP0 is a level corresponding to the overcharge detection voltage and the level of the detection threshold voltage Vn_th2 is a level corresponding to the overdischarge detection voltage, the in-chip control part 30 detects whether each battery cell V is in the overcharge state or in the overdischarge state based on the level of the detection signal OUT outputted from the comparator CMP0 of the detection circuit 26 in the comparison state of each of the detection 1 and the detection 2.

The timing chart shown in FIG. 10 illustrates a case of repeating the detection 1 and the detection 2 in the order starting from the battery cell V on the low voltage side, but the timing of performing the detection 1 and the detection 2 is not limited thereto. For example, the detection 2 may be performed in the order starting from the battery cell V on the low voltage side after the detection 1 is completely performed on all battery cells V in the order starting from the battery cell V on the low voltage side.

Third Embodiment

In the detection circuit 26 of the second embodiment described above, the switch S1 and the switch S2 switch the reference voltage source connected to the terminals b of the capacitors C3 and C4 to any one of the reference voltage sources $V_{REFc}$ to $V_{REFx}$, so as to set a plurality of detection threshold voltage V_th to the comparator CMP0.

In contrast thereto, in the detection circuit 26 of this embodiment, a plurality of capacitors C3 and C4 that have different capacitances are disposed, so as to set a plurality of detection threshold voltages V_th to the comparator CMP0.

Since the overall configuration of the battery monitoring system 10 is substantially the same as that of the first embodiment, the description thereof is omitted here, and the following will describe the detection circuit 26 of this embodiment.

Figure 11:
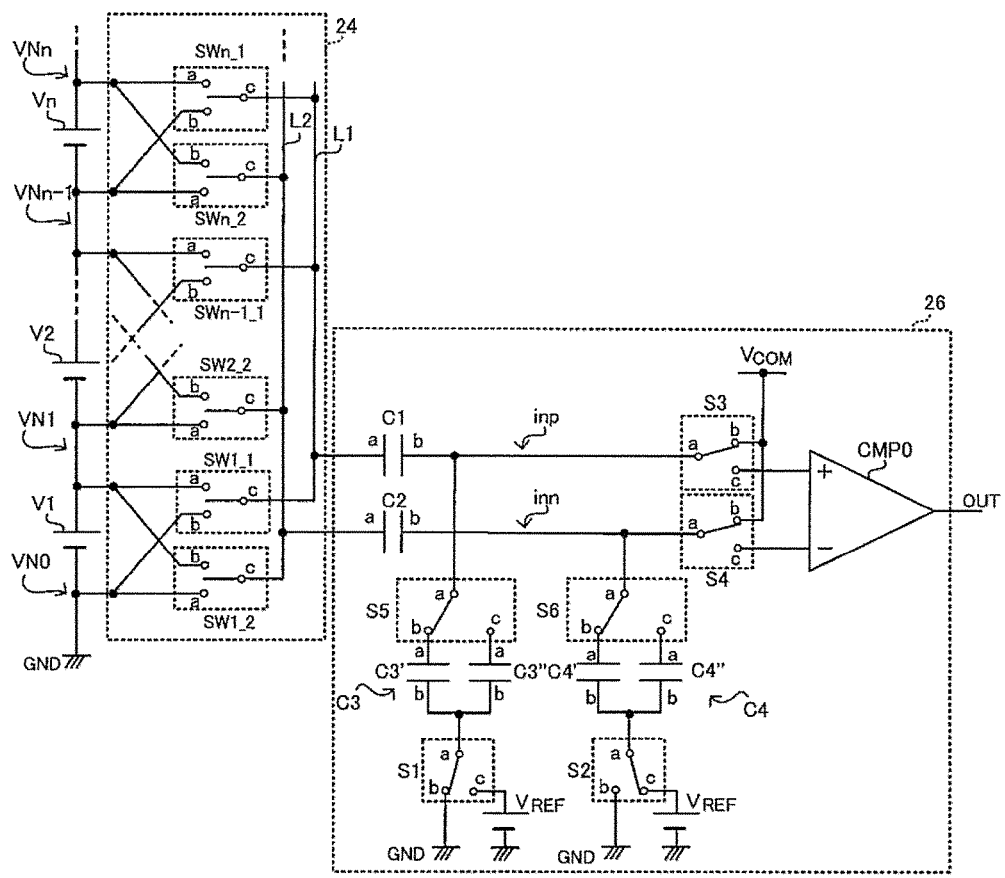
FIG. 11 is a circuit diagram showing an example of the cell selection switch and the detection circuit of the third embodiment.

FIG. 11 illustrates an example of the circuit configurations of the cell selection switch 24 and the detection circuit 26 of this embodiment. The battery cells V and the cell selection switch 24 are illustrated only with reference to the battery cells V1, V2, and Vn in FIG. 11 to facilitate the illustration. Besides, the terminals 21 are omitted from FIG. 11.

As shown in FIG. 11, the cell selection switch 24 of this embodiment is the same as the cell selection switch 24 of the first embodiment. Therefore, the description thereof is omitted here.

In the detection circuit 26 of this embodiment as shown in FIG. 11, the capacitor C3 includes capacitors C3' and C3" that are connected in parallel. Moreover, in the detection circuit 26 of this embodiment, the capacitor C4 includes capacitors C4' and C4" that are connected in parallel.

The detection circuit 26 of this embodiment further includes switches S5 and S6. The switch S5 connects the terminal a of the capacitor C3' or the terminal a of the capacitor C3" to the node inp under control of the in-chip control part 30. Specifically, the terminal a of the switch S5 is connected to the node inp, the terminal b is connected to the terminal a of the capacitor C3', and the terminal c is connected to the terminal a of the capacitor C3".

The terminals b of the capacitors C3' and C3" are connected to the terminal a of the switch S1.

In addition, the switch S6 connects the terminal a of the capacitor C4' or the terminal a of the capacitor C4" to the node inn under control of the in-chip control part 30. Specifically, the terminal a of the switch S6 is connected to the node inn, the terminal b is connected to the terminal a of the capacitor C4', and the terminal c is connected to the terminal a of the capacitor C4".

The terminals b of the capacitors C4' and C4" are connected to the terminal a of the switch S2.

With use of the equation (21) of the first embodiment, as described above, it is known that the detection threshold voltage Vn_th of the comparator CMP0 depends on the capacitance ratios (j, k, m) of the capacitors C1 to C4 and the reference voltage $V_{REF}$.

For example, by connecting the capacitor C3", which has a capacitance different from the capacitor C3', with the node inp to perform the detection operation, the capacitance ratios of the capacitors C1, C2, C3', and C4' are differentiated from the capacitance ratios of the capacitors C1, C2, C3", and C4". Therefore, the detection threshold voltages Vn_th can be set to any different values.

Thus, according to the detection circuit 26 of this embodiment, the capacitors C3' and C3" that have different capacitance ratios or the capacitors C4' and C4" that have different capacitance ratios are disposed corresponding to the desired detection threshold voltage Vn_th, so as to perform detection of the battery cell V according to multiple detection threshold voltages V_th. For example, the detection threshold voltage Vn_th1 corresponding to the overcharge detection voltage can be set according to the above equation (21) based on the capacitance ratios of the capacitors C1, C2, C3', and C4' while the detection threshold voltage Vn_th2 corresponding to the overdischarge detection voltage can be set according to the above equation (21) based on the capacitance ratios of the capacitors C1, C2, C3", and C4".

Figure 12:
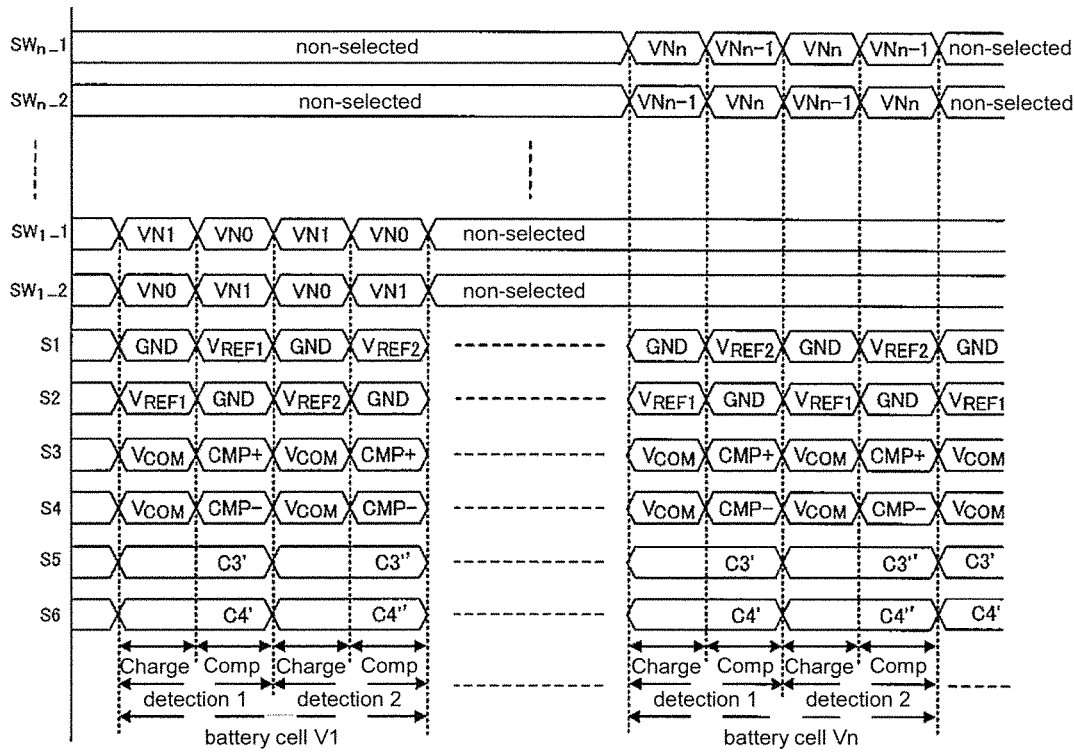
FIG. 12 is a timing chart showing the timing relating to detection of the battery voltage according to the third embodiment.

FIG. 12 is a timing chart showing connection destinations (selection destinations) of the switches SW of the cell selection switch 24 and the switches S1 to S4 of the detection circuit 26 relating to detection of the battery voltage of the battery cell V in this embodiment.

As shown in FIG. 12, when carrying out detection of the battery voltages of the battery cells V, the in-chip control part 30 repeats the control on the charge state (FIG. 10, refer to "Charge") and the comparison state (FIG. 10, refer to "Comp") in the order starting from the battery cell V on the low voltage side, and repeats "detection 1" using the capacitors C3' and C4' and "detection 2" using the capacitors C3" and C4", so as to detect the battery voltage of each battery cell V in a time division manner.

With the in-chip control part 30 performing such control, in the battery monitoring LSI 14 of this embodiment, as described above, for example, when the level of the detection threshold voltage $Vn\_th1$ of the comparator CMP0 is a level corresponding to the overcharge detection voltage and the level of the detection threshold voltage $Vn\_th2$ is a level corresponding to the overdischarge detection voltage, the in-chip control part 30 detects whether each battery cell V is in the overcharge state or in the overdischarge state based on the level of the detection signal OUT outputted from the comparator CMP0 of the detection circuit 26 in the comparison state of each of the detection 1 and the detection 2.

The timing chart shown in FIG. 12 illustrates a case of repeating the detection 1 and the detection 2 in the order starting from the battery cell V on the low voltage side, but the timing of performing the detection 1 and the detection 2 is not limited thereto. For example, the detection 2 may be performed in the order starting from the battery cell V on the low voltage side after the detection 1 is completely performed on all battery cells V in the order starting from the battery cell V on the low voltage side.

In the detection circuit 26 shown in FIG. 11, two capacitors C3 (C3' and C3") connectable to the node inp and two capacitors C4 (C4' and C4") connectable to the node inn are illustrated. However, the number of the capacitors included in the detection circuit 26 is not limited thereto. For example, it is possible to dispose either multiple capacitors connectable to the node inp or multiple capacitors connectable to the node inn. Furthermore, by setting the number of the capacitors connectable to the node inp and the number of the capacitors connectable to the node inn to 3 or more, for example, even more detection threshold voltages $Vn\_th$ can be set to the comparator CMP0.

As described above, the detection circuit 26 of the battery monitoring LSI 14 according to this embodiment includes the first capacitor group and the comparator CMP0. The first capacitor group includes the capacitor C1 and the capacitor C2, wherein one end of the capacitor C1 can be switched to be connected to one of the positive electrode and the negative electrode of the battery cell V, and one end of the capacitor C2 can be switched to be connected to the other electrode opposite to the electrode to which the capacitor C1 is connected. The comparator CMP0 includes the non-inverted input terminal connectable to the battery cell V via the capacitor C1, and the inverted input terminal connectable to the battery cell V via the capacitor C2. The comparator CMP0 compares the battery voltage of the connected battery cell V with the detection threshold voltage $Vn\_th$. The detection circuit 26 further includes the second capacitor group, which includes the capacitor C3 and the capacitor C4. The capacitor C3 is connected in series with the switch S1 between the node inp and the switch S1, wherein the node inp is between the capacitor C1 and the non-inverted input terminal of the comparator CMP0, and the switch S1 switches the connection state between the ground voltage source GND and any one of the reference voltage sources $V_{REF}$. The capacitor C4 is connected in series with the switch S2 between the node inn and the switch S2, wherein the node inn is between the capacitor C2 and the inverted input terminal of the comparator CMP0, and the switch S2 switches the connection state between the ground voltage source GND and any one of the reference voltage sources $V_{REF}$.

Figure 13:
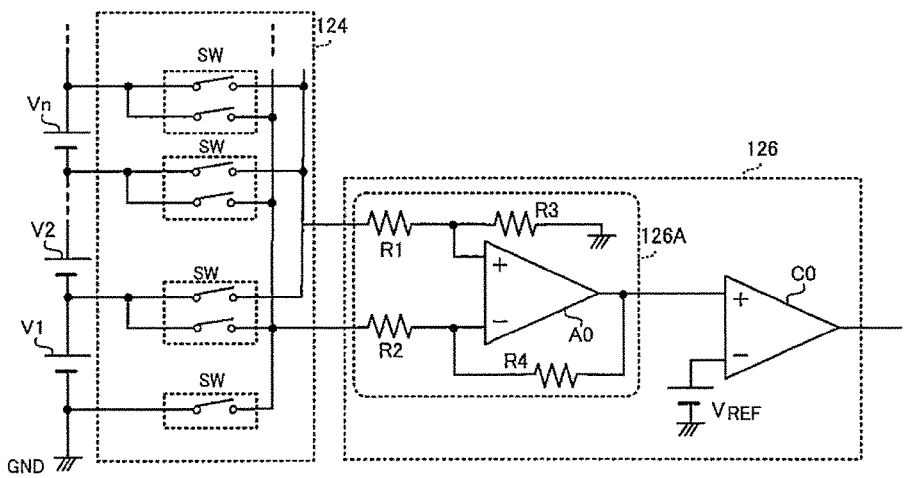
FIG. 13 is a circuit diagram showing an example of the conventional cell selection switch and detection circuit.

In the conventional battery monitoring LSI as shown in FIG. 13, when the cell selection switch 124 is turned on and the positive electrode voltage and the negative electrode voltage of the battery cell V are supplied to the differential amplifier 126A, a current constantly flows through the resistors R1 to R4 and therefore the battery voltage is consumed. In order to suppress the current consumption caused by the resistors R1 to R4, it is necessary to increase the resistances of the resistors R1 to R4. However, as the resistances increase, the area required for disposing the resistors R1 to R4 increases.

In contrast thereto, the detection circuit 26 described in each of the above embodiments is composed of the capacitors C1 to C4 and the switches S1 to S4, and does not include the resistors R1 to R4 of the conventional detection circuit 126. Therefore, when the cell selection switch 124 is turned on and the positive electrode voltage and the negative electrode voltage of the battery cell V are supplied to the differential amplifier 126A, consumption of the battery voltage is suppressed.

Thus, according to the detection circuit 26 of each of the above embodiments, it is possible to achieve low current consumption and miniaturization.

Further, in comparison with the conventional detection circuit 126, the detection circuit 26 of each of the above embodiments is realized by using only one comparator CMP0, instead of two comparators (A0, C0). Thus, it is possible to achieve further miniaturization.

In addition, according to the detection circuit 26 of each of the above embodiments, the detection threshold voltage $Vn\_th$ can be set to the comparator CMP0 according to the capacitance ratios of the capacitors C1 to C4. Thus, the capacitance of each of the capacitors C1 to C4 can be reduced. Therefore, according to the detection circuit 26 of each of the above embodiments, it is possible to achieve further miniaturization.

Moreover, when the conventional detection circuit 126 performs the detection operation, a current flows through the switches SW of the cell selection switch 124 in the ON state. Therefore, the size needs to be increased to reduce the ON resistance of the cell selection switch 124. For the detection circuit 26 of each of the above embodiments, however, the battery voltage is detected in the comparison state after the capacitors C1 to C4 are charged in the charge state. Therefore, the ON resistance of the cell selection switch 24 needs not be taken into consideration. Hence, according to the detection circuit 26 of each of the above embodiments, the size of the cell selection switch 24 can be reduced.

The configuration of the detection circuit 26 described in the embodiments may be used in combination, for example, and is not limited to the illustration of each of the above embodiments. For example, the detection circuit 26 may be configured by combining the second embodiment with the third embodiment to be switchable to multiple reference voltages $V_{REF}$ and switchable to capacitors (C3, C3' and C4, C4') of different capacitance ratios.

In addition, the in-chip control part 30 may have the function of the microcomputer 16 described in the above embodiments. For example, the in-chip control part 30 may directly control the cell selection switch 24 and the detection circuit 26. In that case, the battery monitoring system 10 may not include the microcomputer 16.

Moreover, although the above embodiments illustrate that the detection circuit 26 is adapted to the battery monitoring LSI 14 of the battery monitoring system 10, the device that may use the detection circuit 26 is not limited to the illustration of these embodiments. The detection circuit 26 may be applied to any detection device for detecting the voltage between two terminals.

Furthermore, although the above embodiments illustrate that the detection circuit 26 includes the capacitors C1 to C4, part or all of the capacitors C1 to C4 are not necessarily disposed within the detection circuit 26. For example, part or all of the capacitors C1 to C4 may be disposed in an area outside the detection circuit 26 in the battery monitoring LSI 14, or may be disposed outside the battery monitoring LSI 14 and connected to the detection circuit 26 via terminals, etc.

Needless to say, the configurations and operations of the battery monitoring system 10 and the battery monitoring LSI 14 described in each of the above embodiments are mere examples and may be modified depending on the situation without departing from the spirit of the invention.

What is claimed is:

1. A semiconductor device, comprising:
   a first capacitor group comprising a first capacitor and a second capacitor, wherein an end of the first capacitor is switchable to be connected to one of a positive electrode and a negative electrode of a battery cell, and an end of the second capacitor is switchable to be connected to the other electrode opposite to the electrode to which the first capacitor is connected;
   a comparator comprising a first input terminal and a second input terminal, wherein the first input terminal is connected to the battery cell via the first capacitor and the second input terminal is connected to the battery cell via the second capacitor, and the comparator compares a battery voltage of the battery cell, which has been connected to the comparator, with a predetermined detection voltage,
   a second capacitor group comprising a third capacitor and a fourth capacitor, wherein the third capacitor is connected in series with a first switching element between a first node and the first switching element, and the first node is between the first capacitor and the first input terminal of the comparator, and the first switching element switches a connection state with a ground voltage source that supplies a ground voltage or at least one reference voltage source, and wherein the fourth capacitor is connected in series with a second switching element between a second node and the second switching element, and the second node is between the second capacitor and the second input terminal of the comparator, and the second switching element switches a connection state with the ground voltage source or the at least one reference voltage source,
   a third switching element capable of switching to connect the other end of the first capacitor to any one of the first input terminal of the comparator and a predetermined reference voltage source; and
   a fourth switching element capable of switching to connect the other end of the second capacitor to any one of the second input terminal of the comparator and the predetermined reference voltage source.

2. The semiconductor device according to claim 1, further comprising:
   a switching element group, which comprises a fifth switching element and a sixth switching element, wherein the fifth switching element is capable of switching to connect an end of the first capacitor to one of the positive electrode and the negative electrode of the battery cell and the sixth switching element is capable of switching to connect an end of the second capacitor to the other electrode opposite to the electrode to which the first capacitor is connected.

3. The semiconductor device according to claim 2, wherein:
   the comparator compares the battery voltage with the predetermined detection voltage for each of a plurality of battery cells that are connected in series, and
   the switching element group comprises the fifth switching element and the sixth switching element for each of the battery cells.

4. The semiconductor device according to claim 1, wherein the predetermined detection voltage is determined according to capacitance ratios of respective capacitances of the first capacitor, the second capacitor, the third capacitor, and the fourth capacitor.

5. The semiconductor device according to claim 2, wherein:
   the third capacitor comprises a plurality of capacitors that have different capacitances, and
   the semiconductor device further comprises a seventh switching element capable of switching to connect the first node to an end of any one of the capacitors of the third capacitor.

6. The semiconductor device according to claim 5, wherein:
   the fourth capacitor comprises a plurality of capacitors that have different capacitances, and
   the semiconductor device further comprises an eighth switching element capable of switching to connect the second node to an end of any one of the capacitors of the fourth capacitor.

7. The semiconductor device according to claim 6, further comprising a controller that performs control, such that after the ground voltage source that supplies the ground voltage and a reference voltage source are connected with the other end of the third capacitor and the other end of the fourth capacitor by the first switching element and the second switching element for a predetermined time, a ground voltage source and a reference voltage source, which is different from the ground voltage source and the reference voltage source connected to the other end of the third capacitor and the other end of the fourth capacitor, the other end of the third capacitor and the other end of the fourth capacitor are connected by the first switching element and the second switching element.

8. The semiconductor device according to claim 1, further comprising a detection circuit that detects a state of the battery voltage of the battery cell based on a level of a signal outputted from the comparator.

9. A battery monitoring system, comprising:
   a plurality of batteries connected in series; and
   a semiconductor device, comprising:
   a first capacitor group comprising a first capacitor and a second capacitor, wherein an end of the first capacitor is switchable to be connected to one of a positive electrode and a negative electrode of a battery cell, and an end of the second capacitor is switchable to be connected to the other electrode opposite to the electrode to which the first capacitor is connected;

a comparator comprising a first input terminal and a second input terminal, wherein the first input terminal is connected to the battery cell via the first capacitor and the second input terminal is connected to the battery cell via the second capacitor, and the comparator compares a battery voltage of the battery cell, which has been connected to the comparator, with a predetermined detection voltage;

a second capacitor group comprising a third capacitor and a fourth capacitor, wherein the third capacitor is connected in series with a first switching element between a first node and the first switching element, and the first node is between the first capacitor and the first input terminal of the comparator, and the first switching element switches a connection state with ground voltage source that supplies a ground voltage or at least one reference voltage source, and wherein the fourth capacitor is connected in series with a second switching element between a second node and the second switching element, and the second node is between the second capacitor and the second input terminal of the comparator, and the second switching element switches a connection state with the ground voltage source or the at least one reference voltage source;

a third switching element capable of switching to connect the other end of the first capacitor to any one of the first input terminal of the comparator and a predetermined reference voltage source;

a fourth switching element capable of switching to connect the other end of the second capacitor to any one of the second input terminal of the comparator and the predetermined reference voltage source;

a switching element group comprising a fifth switching element and a sixth switching element, wherein the fifth switching element is capable of switching to connect an end of the first capacitor to one of the positive electrode and the negative electrode of the battery cell and the sixth switching element is capable of switching to connect an end of the second capacitor to the other electrode of the battery cell opposite to the electrode to which the first capacitor is connected; and a controller performing control, such that after the ground voltage source that supplies the ground voltage and a reference voltage source are connected with the other end of the third capacitor and the other end of the fourth capacitor by the first switching element and the second switching element for a predetermined time, a ground voltage source and a reference voltage source, which is different from the ground voltage source and the reference voltage source connected to the other end of the third capacitor and the other end of the fourth capacitor, the other end of the third capacitor and the other end of the fourth capacitor are connected by the first switching element and the second switching element.

10. A detection method for a semiconductor device to detect a battery voltage of a battery cell, wherein the semiconductor device comprises:

a first capacitor group comprising a first capacitor and a second capacitor, wherein an end of the first capacitor is switchable to be connected to one of a positive electrode and a negative electrode of the battery cell, and an end of the second capacitor is switchable to be connected to the other electrode opposite to the electrode to which the first capacitor is connected;

a comparator comprising a first input terminal and a second input terminal, wherein the first input terminal is connected to the battery cell via the first capacitor and the second input terminal is connected to the battery cell via the second capacitor, and the comparator compares the battery voltage of the battery cell, which has been connected to the comparator, with a predetermined detection voltage, a second capacitor group comprising a third capacitor and a fourth capacitor, wherein the third capacitor is connected in series with a first switching element between a first node and the first switching element, and the first node is between the first capacitor and the first input terminal of the comparator, and the first switching element switches a connection state with a ground voltage source that supplies a ground voltage or at least one reference voltage source, and wherein the fourth capacitor is connected in series with a second switching element between a second node and the second switching element, and the second node is between the second capacitor and the second input terminal of the comparator, and the second switching element switches a connection state with the ground voltage source or the at least one reference voltage source, a third switching element capable of switching to connect the other end of the first capacitor to any one of the first input terminal of the comparator and a predetermined reference voltage source; and a fourth switching element capable of switching to connect the other end of the second capacitor to any one of the second input terminal of the comparator and the predetermined reference voltage source, and the detection method comprising a process of:

connecting the ground voltage source that supplies the ground voltage and a reference voltage source to the third capacitor and the fourth capacitor by the first switching element and the second switching element; and after a predetermined time, connecting a ground voltage source and a reference voltage source, which is different from the ground voltage source and the reference voltage source connected with the third capacitor and the fourth capacitor, to the third capacitor and the fourth capacitor by the first switching element and the second switching element.

* * * * *